(12) United States Patent
Hwang et al.

(10) Patent No.: US 8,729,947 B2
(45) Date of Patent: May 20, 2014

(54) WIDE-RANGE GLITCH-FREE ASYNCHRONOUS CLOCK SWITCH

(75) Inventors: Changku Hwang, Santa Clara, CA (US); Sebastian Turullols, Santa Clara, CA (US); Daisy Jian, Santa Clara, CA (US); Ali Vahidsafa, Santa Clara, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 13/604,795

(22) Filed: Sep. 6, 2012

(65) Prior Publication Data

US 2014/0062548 A1    Mar. 6, 2014

(51) Int. Cl.
*G06F 1/04* (2006.01)
*H03K 3/00* (2006.01)

(52) U.S. Cl.
USPC ............................. 327/291; 327/298; 327/299

(58) Field of Classification Search
USPC .......................................... 327/291, 298, 299
See application file for complete search history.

(56) References Cited

U.S. PATENT DOCUMENTS 7,471,120 B2 *   12/2008   Lou ................................. 327/99

* cited by examiner

*Primary Examiner* — John Poos
(74) *Attorney, Agent, or Firm* — Marsh Fischmann & Breyfogle LLP; Daniel J. Sherwinter (57) ABSTRACT

Embodiments include systems and methods for asynchronous, glitch-free clock switching across a wide range of clock frequencies with minimal clock down time. Embodiments effectively provide two stages of synchronization across two independent clock domains. In a first synchronization stage, a received, asynchronous clock select signal is translated into a synchronized clock select signal that is effectively synchronous with respect to a first clock domain and is still effectively asynchronous with respect to a second clock domain. In a second synchronization stage, the synchronized clock select signal is resynchronized so as to be effectively synchronous with respect to the second clock domain. The synchronized select signal can be used to disable the clock of the first clock domain, and the resynchronized clock select signal can be used to enable the clock of the second clock domain.

19 Claims, 5 Drawing Sheets

FIG. 5

WIDE-RANGE GLITCH-FREE ASYNCHRONOUS CLOCK SWITCH

FIELD

Embodiments relate generally to clock switching, and, more particularly, to asynchronous, glitch-free clock switching.

BACKGROUND

The performance of high-end microprocessors has continued to increase over the years. In some cases, this performance increase is associated with higher clock frequencies (and smaller clock periods), which tends to increase power consumption. Higher frequencies and higher power consumption can give rise to various issues in an integrated circuit and/or its packaging, which can tend to limit proper operation of the chip, and can contribute to eventual failure of the chip. More recently, techniques have been employed to mitigate these issues by dynamically changing the operating voltage and/or frequency of the chip.

One such technique is known as Dynamic Voltage Frequency Scaling (DVFS), with which the operating frequency and power supply of a chip can be adjusted at any time (asynchronously). For example, DVFS can be used to reduce power consumption by lowering the operating frequency of the chip when the chip is in a standby mode and/or other less active operating modes. DVFS and other techniques can involve adjusting operating frequencies by switching between two or more clock sources. Traditionally, the clock switching can introduce a glitch in the clock signal and/or long clock down times, particularly when asynchronous operation is desired. These types of glitches are potentially harmful to downstream circuitry, and long down times can introduce undesirable effects (e.g., voltage noise).

BRIEF SUMMARY

Among other things, embodiments provide novel systems and methods for asynchronous, glitch-free clock switching. Embodiments include a clock switching circuit designed in a substantially symmetrical fashion for receiving two clock input signals that effectively manifest two clock domains. A clock select signal is used to select between the two clock domains, and a clock output signal is output from the circuit that corresponds to the selected clock domains. The clock switching circuit uses multi-stage synchronization and delay components to allow asynchronous switching between two clocks having different frequencies (e.g., across a wide range of clock frequencies) in a manner that minimizes clock dead time and processor performance issues during the clock switching. Embodiments of the clock switching functionality can be used to facilitate Dynamic Voltage Frequency Scaling (DVFS). In some implementations, a bypass clock domain is included for testing and/or other purposes.

According to one set of embodiments, a clock switching system is provided. The system includes a first clock domain subsystem and a second clock domain subsystem. The first clock domain subsystem is clocked according to clock timing of a first input clock signal and includes: a first domain pre-synchronization circuit operable to asynchronously receive a clock select signal and generate a synchronized clock select signal that is synchronized with respect to the clock timing of the first input clock signal; and a first domain disable circuit operable, using the synchronized clock select signal, to disable the first input clock signal from controlling a clock output signal after a disable delay that is a function of the clock timing of the first input clock signal. The second clock domain subsystem is clocked according to clock timing of a second input clock signal, the clock timing of the second input clock signal being different from the clock timing of the first input clock signal. The second clock domain subsystem includes a second domain enable circuit operable, using the synchronized clock select signal, to enable the second clock signal to control the clock output signal after an enable delay that is a function of the clock timing of the second input clock signal and is longer than the disable delay. In some such embodiments, the first clock domain subsystem and the second clock domain subsystem are substantially symmetrical in design, and additional circuits are provided for generating and/or passing (e.g., gating) appropriate signals through each clock domain subsystem.

According to another set of embodiments, a method is provided for clock switching. The method includes: synchronizing a clock select signal to a first clock domain corresponding to a first input clock signal having first clock timing; disabling, using the synchronized clock select signal, the first input clock signal from controlling a clock output signal after a disable delay that is a function of the clock timing of the first input clock signal; and enabling, using the synchronized clock select signal, a second input clock signal to control the clock output signal after an enable delay that is a function of clock timing of the second input clock signal, the clock timing of the second input clock signal being different from the clock timing of the first input clock signal, and the enable delay being longer than the disable delay.

According to yet another set of embodiments, a system is provided. The system includes: a first clock source that generates a first clock signal; a second clock source that generates a second clock signal having different clock timing from that of the first clock signal; and a clock switching subsystem. The clock switching subsystem includes: means for synchronizing a received clock select signal to a first clock domain corresponding to the first clock signal; means for disabling the first clock signal from controlling a clock output signal after a disable delay using the synchronized clock select signal, the disable delay being a function of the clock timing of the first clock signal; and means for enabling the second clock signal to control the clock output signal after an enable delay using the synchronized clock select signal, the enable delay being a function of the clock timing of the second clock signal and being longer than the disable delay.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
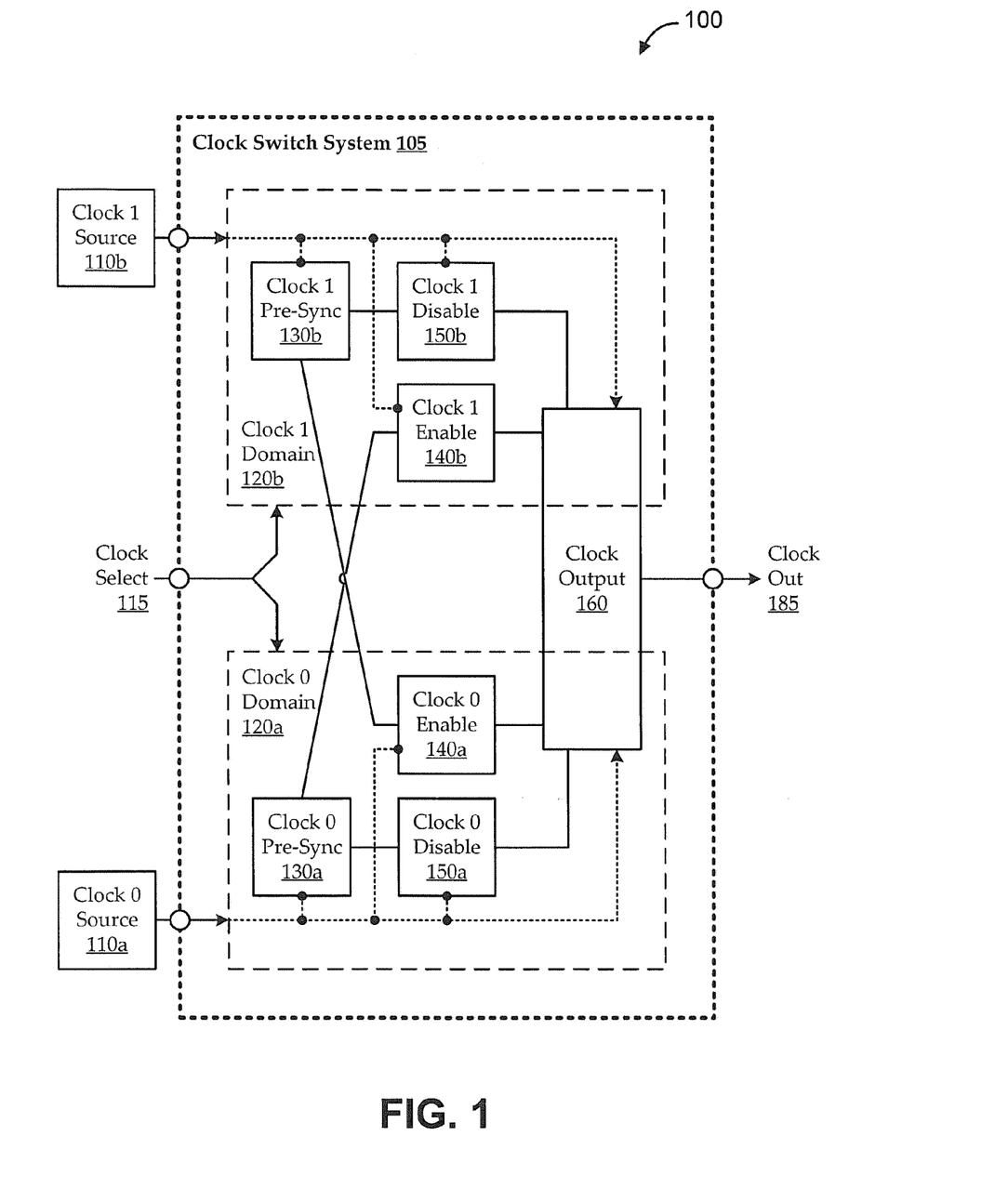
FIG. 1 shows an illustrative clock switching environment having a clock switch system 105, according to various embodiments.

Turning first to FIG. 1, an illustrative clock switching environment 100 is shown having a clock switch system 105, according to various embodiments. The clock switch system 105 is in communication with a first clock source 110a (e.g., "Clock 0"), a second clock source 110b ("Clock 1"), and a clock select signal 115. The clock switch system 105 is designed in a substantially symmetrical manner to operationally manifest a first clock domain 120a and a second clock domain 120b. Input clock signals from the first clock source 110a are used to trigger a first subset of components of the clock switch system 105 to manifest the first clock domain 120a, and input clock signals from the second clock source 110b are used to trigger a second subset of components of the clock switch system 105 to manifest the second clock domain 120b. For example, each clock domain 120 has an associated primary clock frequency and duty cycle as a function of its respective clock source 110.

The clock switch system 105 is operable to generate a clock output signal 185 according to one of the clock domains 120 as selected by the clock select signal 115. For example, when the clock select signal 115 is set to select the first clock domain 120a, the clock output signal 185 is a function of the first clock source 110a. In some implementations, when the clock select signal 115 is set to select the first clock domain 120a, the clock output signal 185 is substantially identical to the clock signal generated by the first clock source 110a. It is assumed, according to some embodiments, that the first clock source 110a and the second clock source 110b are running concurrently, though only one of the clock sources 110 is selected at a time. This allows switching between the clock sources 110 without having to wait for a newly selected clock to start up and stabilize.

For example, a typical microprocessor (e.g., a core microprocessor of a computer) performs operations by switching transistors and/or other components according to a clocking signal. Reducing the switching frequency and/or the voltage at which the microprocessor is operating can reduce power consumed by the microprocessor. This can, in turn, increase operating life, reduce cost, reduce heat, reduce voltage droop, mitigate resonance issues, and/or have other impacts on the microprocessor operation. Techniques, such as Dynamic Voltage Frequency Scaling (DVFS), can be used to adjust the operating frequency and/or operating voltage of a microprocessor at any time (asynchronously), for example, when the microprocessor is in a standby mode and/or other less active operating modes.

Operating frequency can be adjusted in various ways. According to one way, certain clocks are designed to have output frequencies that can be dynamically adjusted (e.g., as a function of voltage and/or other parameters). According to another way, clocks can be coupled with other circuitry that selects an output that is a function of an input clock signal (e.g., as an integer multiple, etc.). These and/or other clocking techniques may not be usable in many contexts, for example, as they may be insufficiently reliable, too limited, too slow to change, etc. To satisfy design constraints of certain contexts, operating frequency can be adjusted by switching asynchronously between different clock sources. However, traditional approaches to switching between clock sources (called "clock switching" herein) can often introduce glitches in the clocking signal, which can yield undesirable results.

Figure 2A:
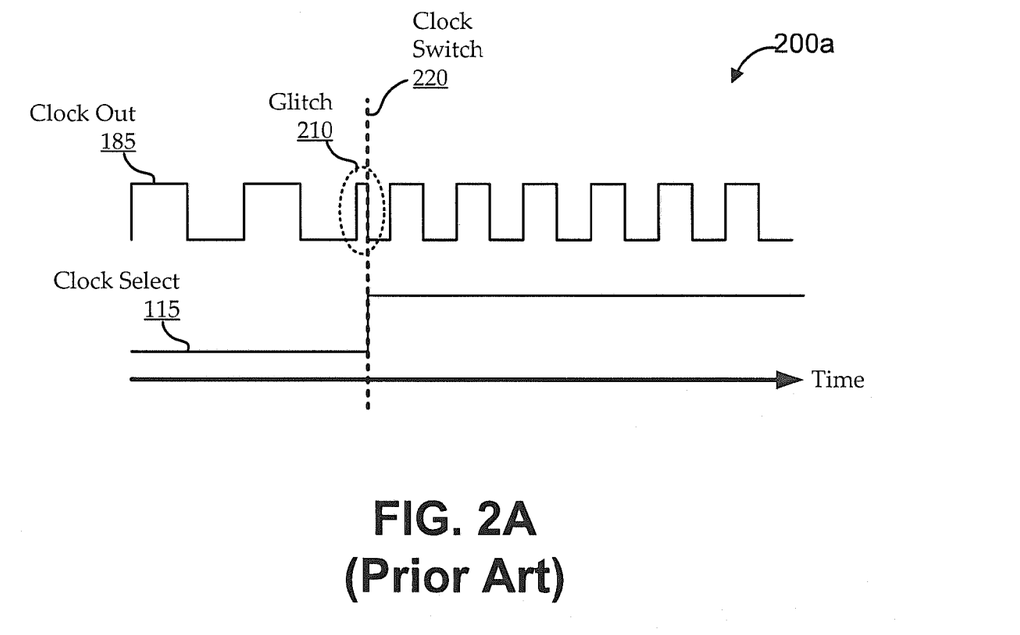
FIG. 2A shows a simplified timing diagram that illustrates a type of clock glitch that can occur with asynchronous clock switching in a traditional implementation.
Figure 2B:
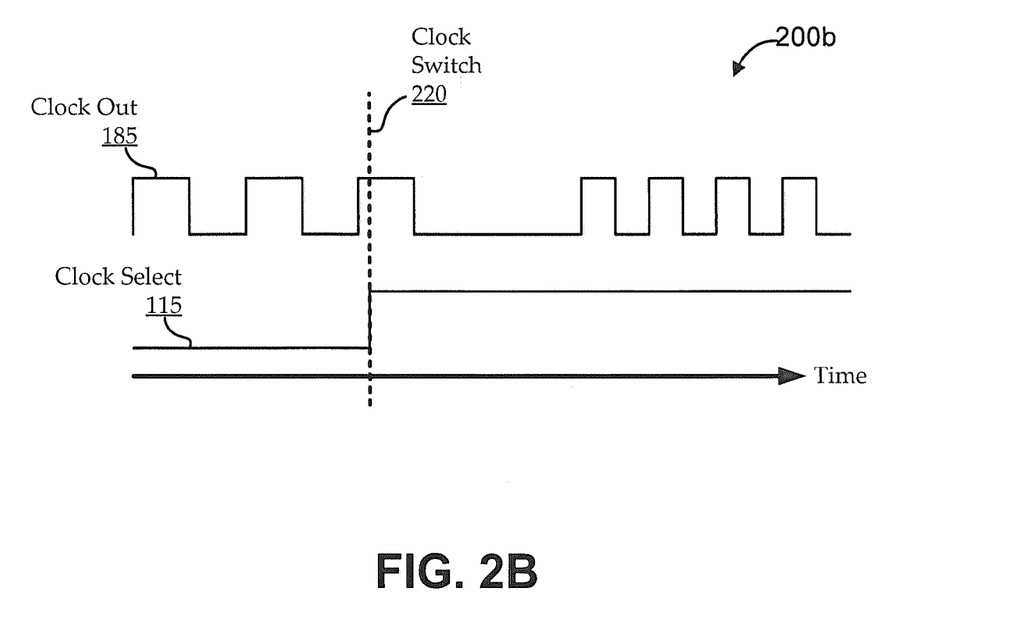
FIG. 2B shows a simplified timing diagram that illustrates glitch-free clock switching, for example, according to various embodiments.

FIGS. 2A and 2B show simplified timing diagrams to add context and clarity to the description. In FIG. 2A, a simplified timing diagram 200a illustrates a type of clock glitch 210 that can occur with asynchronous clock switching in a traditional implementation. For the sake of clarity, the timing diagram 200a is simplified to ignore propagation delays, rise times, fall times, and the like. The clock output signal 185 shows a clocking signal as a square wave with a fifty percent duty cycle. The clock output signal 185 begins with a particular clock frequency corresponding to a first clock source and ends with a different clock frequency corresponding to a second clock source. The clock select signal 115 shows a switch signal that begins as a logical 0 and switches to a logical 1 at a clock switch time 220 indicating switching between the first clock source and the second clock source.

When the clock select signal 115 switches at the clock switch time 220, traditional implementations use a multiplexer ("MUX") or other technique to substantially immediately switch the clock output signal 185 from the first clock source to the second clock source. Due to the asynchronous switching of the clock select signal 115, however, the clock output signal 185 can be at any point in the period of the clocking signal corresponding to the first clock source when the clock signal 115 switches at the clock switch time 220. Accordingly, the clock period can be truncated, manifesting as a clock glitch 210 in the clock output signal 185. The clock glitch 210 can create timing and/or other problems in downstream circuitry that relies on the clock output signal 185.

FIG. 2B shows a simplified timing diagram 200b that illustrates glitch-free clock switching, for example, according to various embodiments. As in FIG. 2A, the clock output signal 185 begins with a particular clock frequency corresponding to the first clock source and ends with a different clock frequency corresponding to a second clock source, and the clock select signal 115 switches between a logical 0 and a logical 1 at clock switch time 220. Unlike in FIG. 2A, however, there is no clock glitch 210. When the clock select signal 115 switches at clock switch time 220, various synchronization operations occur, for example, as described above with reference to FIG. 1. This can manifest as a delay, during which clocking corresponding to the first clock source ends in what appears to be a synchronous fashion, clocking corresponding to the second clock source begins in what appears to be a synchronous fashion, and the clocking corresponding to the first clock source and the clocking corresponding to the second clock source are separated by some amount of clock "down time" (i.e., during which there is effectively no clocking). Different implementations can yield different delays, including, for example, different numbers of cycles corresponding to the first clock source before clock downtime begins and/or different amounts of clock down time. Some embodiments are designed to minimize the amount of clock down time, while ensuring glitch free clock switching.

Turning back to FIG. 1, each clock domain 120 of the clock switch system 105 includes a number of functional components. As illustrated, embodiments of the clock domains 120 include a clock pre-synchronization subsystem 130, a clock enable subsystem 140, and a clock disable subsystem 150. The clock domains 120 feed into a clock output subsystem 160 that generates the clock output signal 185. In some implementations, each subsystem of each clock domain 120 is clocked by its respective clock source 110. For example, in the clock 0 domain 120a, the clock 0 source 110a is used as the clocking signal for each of the clock 0 pre-synchronization subsystem 130a, the clock 0 enables subsystem 140a, and the clock 0 disable subsystem 150a. In the clock 0 domain 120a, the clock 0 source 110a can also be used as the clocking signal for components of the clock output subsystem 160 or of the entire clock output subsystem 160 when the clock select signal 115 is set to select the clock 0 source 110a as the output clock.

When the clock select signal 115 switches from one clock source 110 to another, embodiments perform a number of synchronization operations. The synchronization operations effectively translate asynchronous switching of the clock select signal 115 into synchronous disabling of the deselected clock with respect to its clock domain 120 and synchronous enabling of the selected clock with respect to its clock domain 120, even when operation of the two clock domains 120 are not synchronous with respect to one another. Embodiments tailor the synchronization operations in such a way that the asynchronous clock select signal 115 can be used to provide glitch-free switching between two clock domains 120 over a wide range of clock frequencies.

For the sake of illustration, suppose the clock output signal 185 presently corresponds to the clock 0 source 110a (e.g., the clock output signal 185 is substantially identical to or is some function of the clock 0 source 110a clocking signal), and the clock select signal 115 switches to disable clock 0 and to enable clock 1. The change in the clock select signal 115 is synchronized to the clock 0 domain 120a using the clock 0 pre-synchronization subsystem 130a. The synchronized signal is used to disable clock 0 via the clock 0 disable subsystem 150a and is used to enable clock 1 via the clock 1 enable subsystem 140b. The changes are propagated through the clock output subsystem 160, thereby causing the clock output signal 185 to correspond to the clock 1 source 110b. Later, the clock select signal 115 switches to disable clock 1 and to enable clock 0. The change in the clock select signal 115 is synchronized to the clock 1 domain 120b using the clock 1 pre-synchronization subsystem 130b. The synchronized signal is used to disable clock 1 via the clock 1 disable subsystem 150b and is used to enable clock 0 via the clock 0 enable subsystem 140a. The changes are propagated through the clock output subsystem 160, thereby causing the clock output signal 185 to correspond to the clock 0 source 110a.

The embodiment of the clock switch system 105 illustrated in FIG. 1 is intended generally to show novel functionality through various subsystems, but is not intended to limit implementation of that functionality. Various functions may be performed by other subsystems, split between multiple systems, etc. Further, additional components, subsystems, and the like may be provided for additional functionality. For example, other embodiments of clock switch systems 105 are shown in FIGS. 3 and 4.

Figure 3:
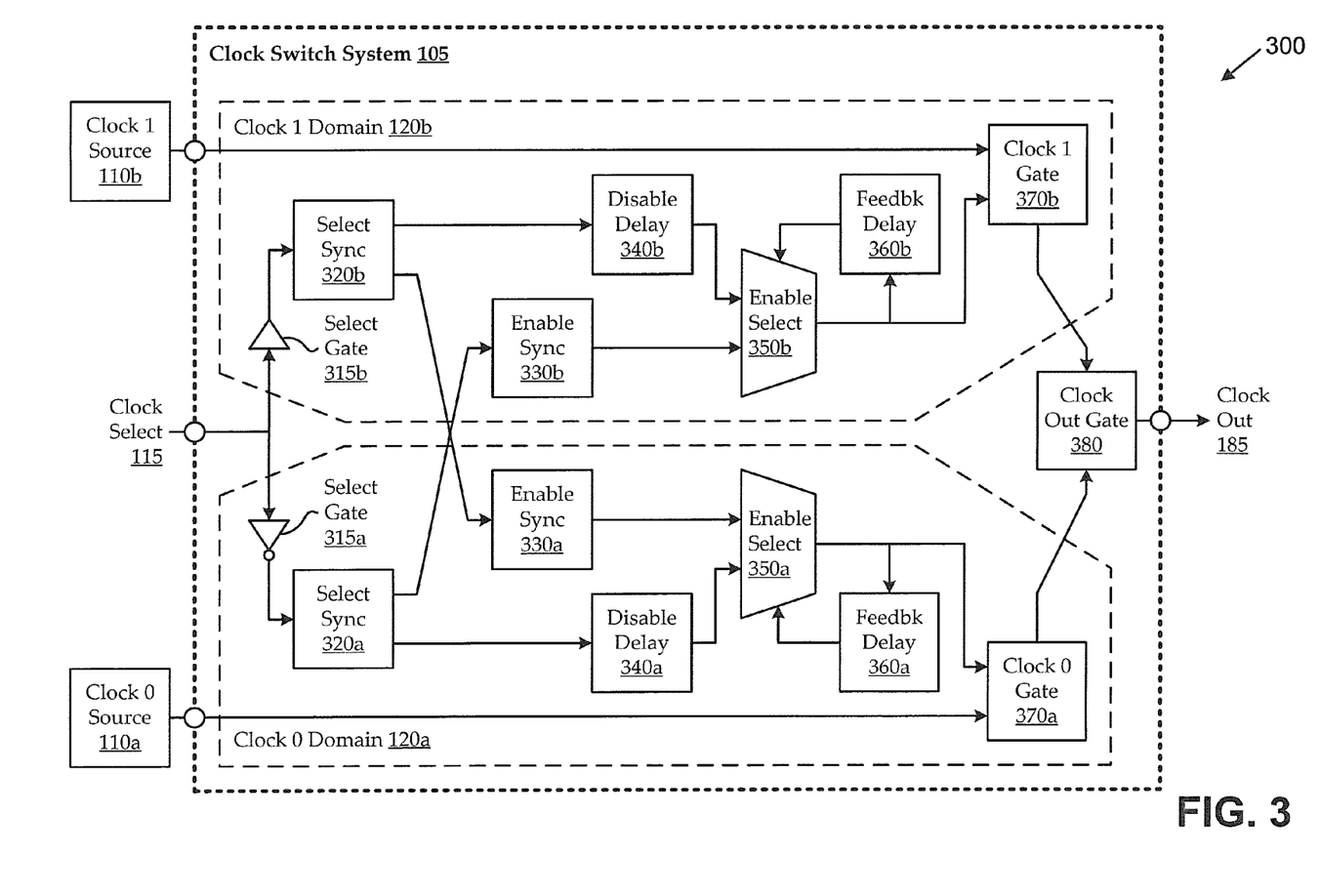
FIG. 3 shows a simplified block diagram of a clock switch system operating in a clock switching environment, according to various embodiments.
Figure 4:
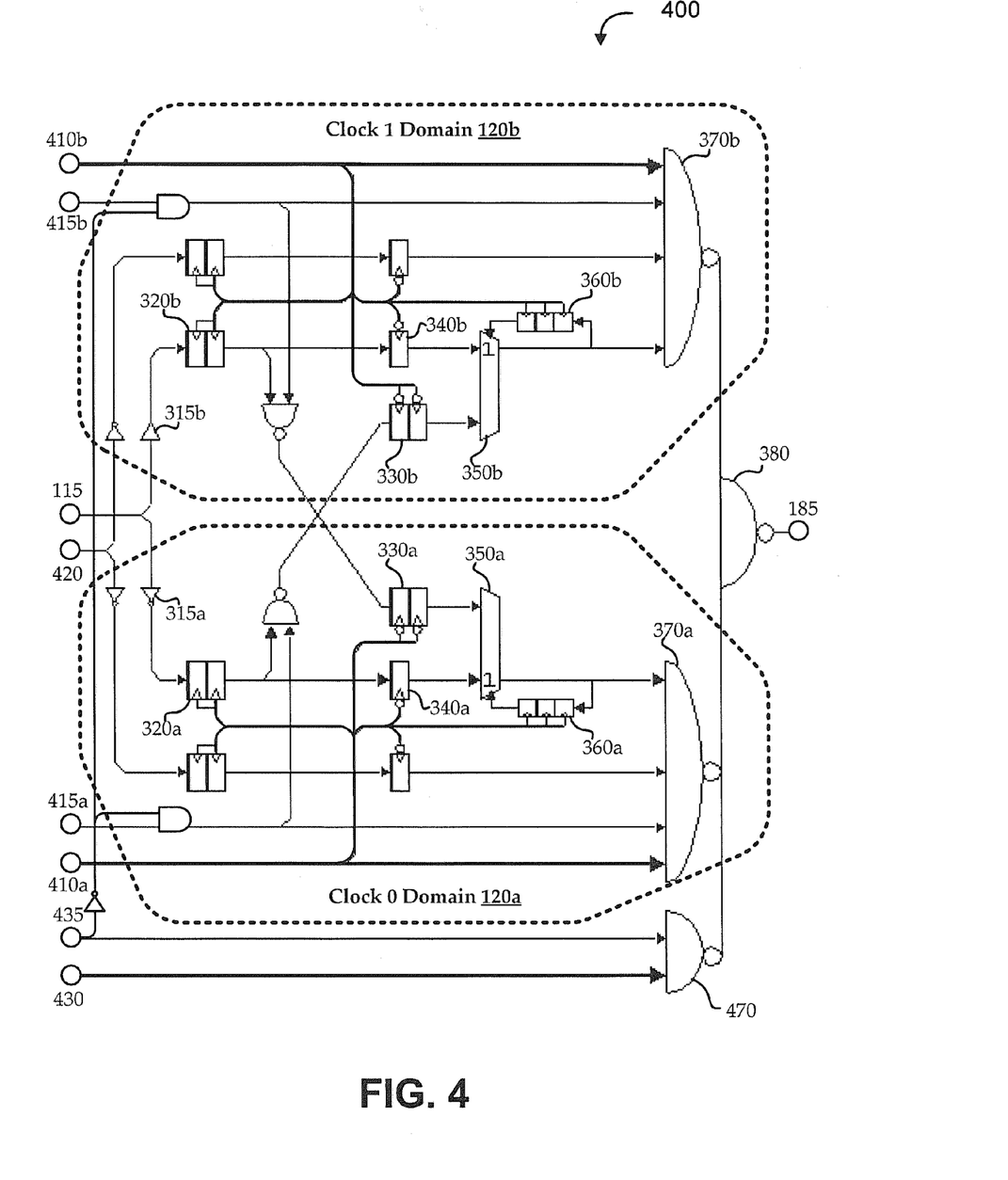
FIG. 4 shows a simplified schematic diagram of an illustrative clock switch circuit for providing asynchronous, glitch-free clock switching, according to various embodiments.

FIG. 3 shows a simplified block diagram of a clock switch system 105 operating in a clock switching environment 300, according to various embodiments. The clock switch system 105 is in communication with a clock 0 source 110a, a clock 1 source 110b, and a clock select signal 115, from which the clock switch system 105 is operable to generate a clock output signal 185. As described above, the clock switch system 105 can be designed in a substantially symmetrical manner to operationally manifest a clock 0 domain 120a and a clock 1 domain 120b. When the clock select signal 115 is set to select the clock 0 domain 120a, the clock output signal 185 is a function of the clock 0 source 110a; and when the clock select signal 115 is set to select the clock 1 domain 120b, the clock output signal 185 is a function of the clock 1 source 110b.

In the illustrated embodiment, the clock select signal 115 is coupled with complementary clock select gates 315. For example, when the clock select signal 115 is high (e.g., logical 1), a logical high signal is sent to the clock 1 domain 120b, and a logical low signal is sent to the clock 0 domain 120a. Once the clock select signal 115 changes, the change propagates through the select synchronization subsystems 320 of each clock domain 120. The select synchronization subsystem 320 can be implemented as a component of the clock pre-synchronization subsystem 130 of FIG. 1. In some implementations, the select synchronization subsystem 320 effectively translates the asynchronous change in the clock select signal 115 into a synchronous signal change with respect to each independent clock domain 120. Accordingly, the output of each select synchronization subsystem 320 can be considered and used as a synchronous clock select signal for each respective clock domain 120.

In each clock domain 120, the effectively synchronous clock select signal can be used to disable its own clock and to enable the clock of the other clock domain 120. For example, suppose that the clock select signal 115 is initially low (e.g., logical 0), such that the clock 0 source 110a is selected to control the clock output signal 185. When the clock select signal 115 switches to high (e.g., logical 1), the signal change propagates concurrently, though differently, through each clock domain 120. In the clock 0 domain 120a, the change is inverted through the clock select gate 315a, and the resulting transition to a logical low propagates over a first pre-synchronization delay through the select synchronization subsystem 320a, the first pre-synchronization delay being a function of the clock 0 source 110a clocking signal. Concurrently, in the clock 1 domain 120b, the same signal change is passed (i.e., without inversion) through the clock select gate 315b, and the transition to a logical high propagates over a second pre-synchronization delay through the select synchronization subsystem 320b, the second pre-synchronization delay being a function of the clock 1 source 110b clocking signal.

The output of the select synchronization subsystem 320a reflects the transition in the clock select signal 115, but is effectively synchronized to the clock 0 domain after the first pre-synchronization delay. This synchronized transition is seen at the input of a disable delay subsystem 340a in the clock 0 domain 120a and, substantially concurrently, at the input of an enable synchronization subsystem 330b in the clock 1 domain 120b. In the clock 0 domain 120a, the disable delay subsystem 340a generates a disable delay that is a function of the clock 0 source 110a clocking signal, after which the clock 0 source 110a clocking signal is no longer controlling the clock output signal 185. For example, after the disable delay, the transition of the synchronized version of the clock select signal 115 propagates through an enable select subsystem 350a to change the state of a clock 0 gate 370a. Changing the state of the clock 0 gate 370a causes the clocking signal from the clock 0 source 110a to no longer be passed through to a clock out gate 380 that controls the clock output signal 185. This effectively disables clock 0 and begins the clock down time.

In the clock 1 domain 120b, the transition of the synchronized version of the clock select signal 115 is effectively re-synchronized to the clock 1 domain 120b by the enable synchronization subsystem 330b. The enable synchronization subsystem 330b generates an enable delay that is a function of the clock 1 source 110b clocking signal. After the enable delay, a resynchronized version of the clock select transition propagates, via an enable select subsystem 350b, to change the state of a clock 1 gate 370b. Changing the state of the clock 1 gate 370b causes the clocking signal from the clock 1 source 110b to pass through to the clock out gate 380, thereby controlling the clock output signal 185. This effectively enables clock 1 and ends the clock down time.

In a similar or identical fashion, the clock select signal 115 can be used to switch control of the clock output signal 185 from the clock 1 source 110b back to the clock 0 source 110a. For example, a transition of the clock select signal 115 from high back to low is synchronized after a pre-synchronization delay to the clock 1 domain 120b. The synchronized transition propagates through various components of the clock 1 domain 120b, ultimately disabling the clock 1 source 110b from controlling the clock output signal 185 after at least a disable delay. Concurrently, the synchronized transition propagates to the clock 0 domain 120a, where it is resynchronized to the clock 0 domain 120a. The resynchronized transition propagates through various components of the clock 0 domain 120a, ultimately enabling the clock 0 source 110a to control the clock output signal 185 after at least an enable delay.

Embodiments are designed so that the enable delay of the slower clock source 110 is at least as long as the disable delay of the faster clock source 110. This ensures that the deselected clock is fully disabled prior to the selected clock being enabled. Further, this helps ensure that no glitch with occur when the clocks are switched. Because the disabling is performed synchronously with the deselected clock, at least one full clock cycle of the deselected clock will complete before the clock down time begins; and because the enabling is performed synchronously with the selected clock, the clock down time ends at the start of a clock cycle of the selected clock.

In some embodiments, a further feedback delay is generated by a feedback delay subsystem 360. For example, as described above, a synchronized transition will propagate through the enable select subsystem 350 of one clock domain 120 causing the respective clock to be disabled, and a resynchronized transition will propagate through the enable select subsystem 350 of the other clock domain causing the respective clock to be enabled. The feedback delay can be used to help ensure that, after the transition of the clock select signal 115 has propagated through to affect the clock output signal 185, the outputs of the enable select subsystems 350 are held until another transition occurs on the clock select signal 115.

FIG. 4 shows a simplified schematic diagram of an illustrative clock switch circuit 400 for providing asynchronous, glitch-free clock switching, according to various embodiments. The clock switch circuit 400 can be an implementation of the clock switch system 105 shown in FIG. 1 or 3. The clock switch circuit 400 is illustrated as receiving eight input signals: a clock 0 clocking signal 410a (e.g., which can be received from a clock 0 source 110a (not shown)), a clock 1 clocking signal 410b (e.g., which can be received from a clock 1 source 110b (not shown)), a clock select signal 115, a "clock 0 running" signal 415a, a "clock 1 running" signal 415b, a "stop" signal 420, a "bypass clock" signal 430 (e.g., which can be received from a bypass or test clock source (not shown)), and a "bypass enable" signal 435. The clock switch circuit 400 outputs a clock output signal 185 that is a function of one of the clock 0 clocking signal 410a, the clock 1 clocking signal 410b, or the bypass clock signal 430, depending on the state of some or all of the other input signals.

The clock switch circuit 400 is substantially symmetrical and operationally manifests a clock 0 domain 120a corresponding to the clock 0 clocking signal 410a and a clock 1 domain 120b corresponding to the clock 1 clocking signal 410b. For example, each clock domain 120 includes a corresponding clocking signal 410 and clock running signal 415. When one of the clock domains 120 is selected via the clock select signal 115, the corresponding clocking signal 410 controls the clock output signal 185 (assuming the clocking signal is not otherwise stopped, for example, via the stop signal 420, the bypass enable signal 435 or the respective clock running signal 415). For testing and/or other purposes, a bypass domain is added that includes the bypass clock signal 430 and the bypass enable signal 435. When the bypass domain is enabled via the bypass enable signal 435, the clock 0 and clock 1 are disabled, and the bypass clock signal 430 is used instead to control the clock output signal 185. The stop signal 420 is configured to disable both clock 0 and clock 1 from controlling the clock output signal 185. As illustrated, implementations can be configured so that clock 0 and clock 1 are disabled in an effectively synchronous fashion, even when the bypass enable signal 435 and/or the stop signal 420 are asynchronous.

The clock switch circuit 400 is designed at least to receive an asynchronous clock select signal 115 and generate effectively synchronous enable and disable information for glitch-free switching between the input clocking signals 410. For the sake of clarity, circuit components are labeled according to their functional correspondence with subsystems of FIG. 3. These labels and functional correspondences are intended only to further illustrate one implementation and should not be construed as limiting embodiments of the various subsystems described in FIG. 3.

In the illustrated embodiment, the clock select signal 115 is coupled with complementary clock select gates 315, effectively transforming the single clock select signal 115 transition concurrently into an enable signal for the selected clock domain 120 and a disable signal for the deselected clock domain 120. The transition in the clock select signal propagates through the select synchronization subsystems 320 of each clock domain 120. The select synchronization subsystems 320 are each implemented as two, rising-edge-triggered flip-flops, so that information from the clock select signal 115 transition is effectively output from each select synchronization subsystem 320 after two cycles of its respective clocking signal 410. The two clock cycles manifest as a pre-synchronization delay. As described above, this output can be considered and used as an enable signal or a disable that is synchronized to each respective clock domain 120.

The synchronized clock select signal output from each select synchronization subsystem 320 is passed to a disable delay subsystem 340 of its respective clock domain 120 and to an enable synchronization subsystem 330 of the other clock domain 120. As illustrated, each disable delay subsystem 340 can be implemented as a single, falling-edge-triggered flip-flop, effectively generating a half-clock-cycle disable delay before the transition information propagates to one input of an enable select subsystem 350, implemented as a two-input MUX. Each enable synchronization subsystem 330 is implemented as a pair of falling-edge-triggered flip-flops, effectively re-synchronizing the clock select transition information to the other clock domain 120 over 1.5-cycles of the clocking signal 410 of the other clock domain 120 (i.e., an enable delay). The re-synchronized transition information propagates to an input of the enable select subsystem 350 of the other clock domain. The enable select subsystems 350 are configured to use or ignore the transition information as desired. For example, while each clock domain 120 generates both an enable and a disable signal, its enable select subsystem 350 only passes the signal that is desired for that clock domain 120 and that clock select transition.

The selected output of the enable select subsystems 350 are passed to respective clock gates 370. As illustrated, the clock gates 370 are implemented as four-input NAND gates, so that the output of each clock gate 370 is a logical 1 whenever any of its inputs is a logical 0. In normal operation (not using the bypass clock), one input of each clock gate 370 is driven by a logical AND of the respective clock running signal 415 and an inverted version of the bypass enable signal 435, which yields a logical 1; and a second input of each clock gate 370 is driven by an inverted and synchronized version of the stop signal 420, which yields a logical 1; a third input of each clock gate 370 is driven by the respective clocking signal 410; and a fourth input of each clock gate 370 is driven by the output of the enable select subsystem 350. Accordingly, when the output of the enable select subsystem 350 is a logical 0, the output of the respective clock gate 370 will always be a logical 1; and when the output of the enable select subsystem 350 is a logical 1, the output of the respective clock gate 370 will substantially correspond to the respective clocking signal.

In some embodiments, a feedback delay subsystem 380 is used to generate a feedback delay after clock switching during which no other changes can be made to the enable select subsystems 350. As illustrated, the feedback delay subsystem 380 is implemented as a multiple-stage flip-flop (e.g., three or five flip-flops configured to add three or five clock cycles of feedback delay). As described above, each clock domain 120 generates both an enable and a disable signal in response to the clock select transition (for the sake of symmetrical design), and the enable select subsystem 350 ensure that only one of those signals is used in each clock domain 120. If, for example, a disable signal received at the MUX were followed by an enable signal received at the MUX, and both were passed through the MUX, the resulting clock output signal 180 could be incorrect. Accordingly, the feedback delay helps ensure that, after the transition of the clock select signal 115 has propagated through to affect the clock output signal 185, the outputs of the enable select subsystems 350 are held for long enough to ensure that another transition is the result of a new transition on the clock select signal 115 and not stray signal propagation.

In the bypass domain, the bypass clock signal 430 and the bypass enable signal 435 are inputs to a bypass clock gate 470, implemented as a two-input NAND gate. In bypass mode, the bypass enable signal 435 is switched to a logical 1, causing one input of each clock gate 370 to switch to a logical 0, thereby holding the output of each clock gate 370 at a logical 1 (i.e., disabling both clocking signals 410 from controlling the clock output signal). At the same time, switching the bypass enable signal 435 to a logical 1 causes the output of the bypass clock gate 470 to substantially correspond to the bypass clock signal 430.

As illustrated, the outputs of the two clock gates 370 and the bypass clock gate 470 are inputs to a clock out gate 380, implemented as a three-input NAND gate. In normal operation, the output of the bypass clock gate 470 is a logical 1, the output of the disabled one of the clock gates 370 is a logical 1, and the output of the enabled one of the clock gates 370 substantially corresponds to the enabled clocking signal. Accordingly, the output of the clock out gate 380 also substantially corresponds to the enabled clocking signal.

When clock switching occurs, two paths can be considered: a clock enable path, and a clock disable path. These two paths have different propagation times due to differences in introduced delays and other factors. As described above, embodiments seek to ensure the propagation time of the enable path is longer than that of the disable path, so that a deselected clock is disabled before a selected clock is enabled without introducing a clock glitch. In the illustrated clock switch circuit 400, when the clock switches from clock 0 to clock 1, the range of propagation time difference between the two paths can be calculated as follows:

maximum path propagation time=$2T_1-0.5T_0$+prop_delays; and minimum path propagation time=$T_1-0.5T_0$+prop_delays, where $T_0$ represents a clock cycle time of clock 0, $T_1$ represents a clock cycle time of clock 1, and prop_delays represents various propagation delays associated with the circuit components (e.g., the 2-input NAND gate, the setup time of the flip-flops, etc.). From the above equations, for the illustrated implementation, $2>f_0/f_1>\frac{1}{2}$, where $f_0$ represents a clock frequency of clock 0, and $f_1$ represents a clock frequency of clock 1. Thus, theoretically, the illustrated implementation can handle glitch-free clock switching where one clock is up to twice the frequency of the other clock.

Some embodiments further seek to minimize clock down time, so that the selected clock is enabled as soon as possible after the deselected clock is disabled. Minimizing clock down time can also avoid excessive, so-called inductive or "Ldi/dt" noise. For example, when the clock switches from clock 0 to clock 1, the range of clock down time can be calculated to include a half cycle of the previous clock as:

maximum clock down time=$2.5T_1-0.5T_0$+prop_delays; and minimum=$1.5T_1-0.5T_0$+prop_delays.

Figure 5:
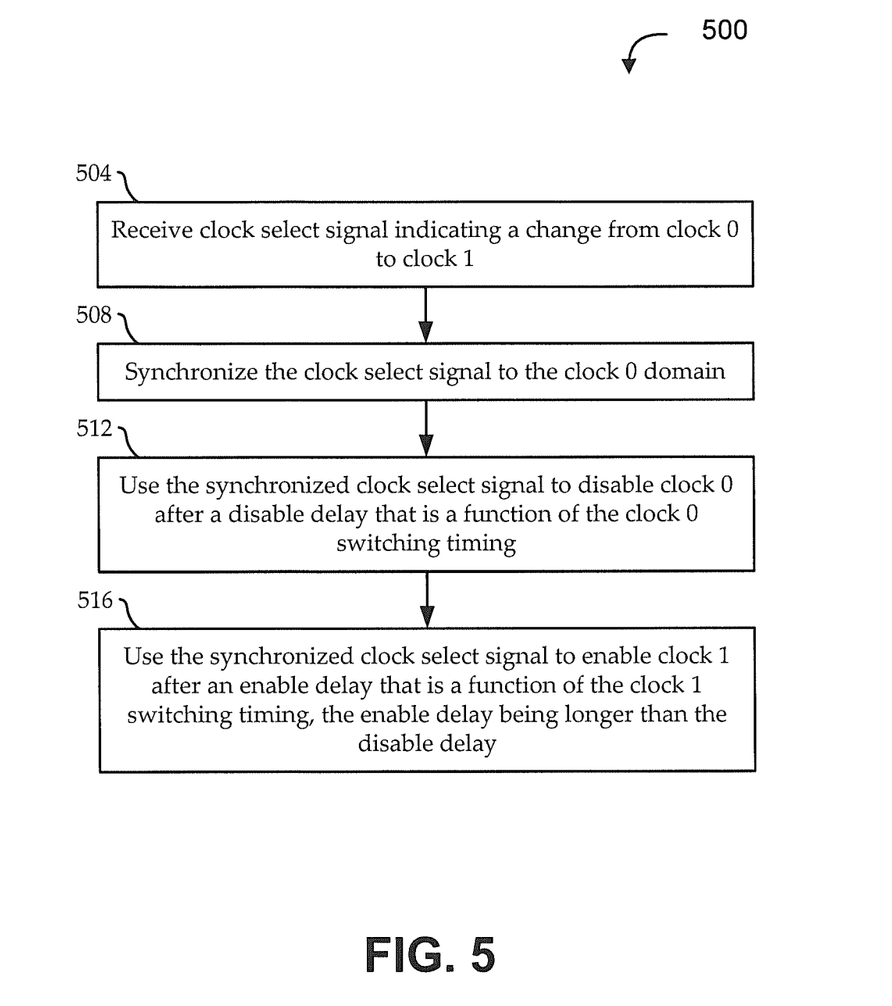
FIG. 5 shows a flow diagram of an illustrative method for asynchronous, glitch-free clock switching, according to various embodiments.

Turning to FIG. 5, a flow diagram is provided of an illustrative method 500 for asynchronous, glitch-free clock switching, according to various embodiments. The method 500 operates in context of a clock switching environment in which an output clock signal is controlled by one of a number of input clock signals as selected by a clock select signal. Embodiments of the method 500 begin at stage 504 by receiving a clock select signal indicating a change from a first clock to a second clock. For example, prior to receiving the clock select signal, a clock output signal is being controlled by a first clock input signal, so that the clock output signal substantially corresponds to or is a function of the first clock input signal. In response to an external trigger event (e.g., transition of a microprocessor into a standby mode), a determination is made to switch control of the clock output signal over to the second clock. This determination causes the clock select signal to be switched indicating the change from the first clock to the second clock.

At stage 508, the transition in the clock select signal is synchronized to a first clock domain corresponding to the first clock. For example, the clock select signal propagates through a subsystem that is clocked according to the first clock so that the output of the subsystem propagates to other components of the first clock domain in an effectively synchronous manner with respect to the first clock domain. As described above, the output of the subsystem can be considered as a synchronized version of the clock select signal.

At stage 512, the synchronized clock select signal is used to disable the first clock after a disable delay. As described above, the first clock may continue to run after it is disabled, though it will not control the clock output signal. The disable delay is controlled by and is a function of the first clock domain. For example, the synchronized clock select signal propagates through a disable subsystem that is clocked according to the first clock so that a transition on the input of the disable subsystem is seen at the output of the disable subsystem after a disable delay that is some number of clock cycles of the first clock. The output of the disable subsystem is used to disable the first clock after the disable delay.

At stage 516, the synchronized clock select signal is used to enable the second clock after and enable delay. The enable delay is controlled by and is a function of the second clock domain and is longer than the disable delay. For example, the synchronized clock select signal propagates through an enable subsystem that is clocked according to the second clock. In some cases, the synchronized clock select signal reaches the enable subsystem in an apparently asynchronous fashion and is resynchronized as it propagates through the enable subsystem. The resynchronized clock select signal transition is seen at the output of the enable subsystem in an apparently synchronous fashion with respect to the second clock domain. The output of the enable subsystem is used to enable the second clock after the enable delay.

In some embodiments, the method 500 effectively provides two stages of synchronization across two independent clock domains. An asynchronous clock select signal is received. In a first synchronization stage, the asynchronous clock select signal is translated into a synchronized clock select signal that is effectively synchronous with respect to the first clock domain and is still effectively asynchronous with respect to the second clock domain. The synchronized select signal can be used, then, to synchronously disable the clock of the first clock domain. In a second synchronization stage, the synchronized clock select signal is resynchronized so as to be effectively synchronous with respect to the second clock domain (and unused by the first clock domain). The resynchronized clock select signal can be used, then, to synchronously enable the clock of the second clock domain. This multi-stage synchronization allows the asynchronous clock select signal to be used for glitch-free clock switching across a wide range of clock frequencies with minimal clock down time.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The various operations of methods and functions of certain system components described above may be performed by any suitable means capable of performing the corresponding functions. The means may include various hardware and/or software component(s) and/or module(s), including, but not limited to a circuit, an application specific integrated circuit (ASIC), or processor. For example, logical blocks, modules, and circuits described may be implemented or performed with a general purpose processor, a digital signal processor (DSP), an ASIC, a field programmable gate array signal (FPGA), or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A clock switching system comprising:
a first clock domain subsystem that is clocked according to clock timing of a first input clock signal and comprises:
   a first domain pre-synchronization circuit operable to asynchronously receive a clock select signal and generate a synchronized clock select signal that is synchronized with respect to the clock timing of the first input clock signal; and
   a first domain disable circuit operable, using the synchronized clock select signal, to disable the first input clock signal from controlling a clock output signal after a disable delay that is a function of the clock timing of the first input clock signal;
a second clock domain subsystem that is clocked according to clock timing of a second input clock signal, the clock timing of the second input clock signal being different from the clock timing of the first input clock signal, the second clock domain subsystem comprising:
   a second domain enable circuit operable, using the synchronized clock select signal, to enable the second clock signal to control the clock output signal after an enable delay that is a function of the clock timing of the second input clock signal and is longer than the disable delay; and
   a feedback delay circuit operable to prevent changes in the selection output from the enable select circuit after a transition in the selection output occurs for a feedback delay that is a function of the clock timing of the first input clock signal.

2. The clock switching system of claim 1, wherein the first domain pre-synchronization circuit comprises at least two flip-flops clocked according to the first input clock signal, such that a transition in the clock select signal is asynchronously received at an input to a first flip-flop in the first domain pre-synchronization circuit and the transition is reflected on a last flip-flop of the first domain pre-synchronization circuit synchronously with respect to the clock timing of the first input clock signal after at least two clock cycles of the first input clock signal.

3. The clock switching system of claim 1, wherein the first domain disable circuit comprises at least one flip-flop clocked according to a falling edge of the first input clock signal, such that a transition in the clock select signal is synchronously received at an input to the first domain disable circuit from the first domain pre-synchronization circuit and the transition is reflected on an output of the first domain disable circuit after at least a half clock cycle of the first input clock signal.

4. The clock switching system of claim 1, wherein the second domain enable circuit comprises at least two flip-flops clocked according to the second input clock signal, such that a transition in the clock select signal is synchronously received at an input to the second domain enable circuit from the first domain pre-synchronization circuit and the transition is reflected on an output of the second domain enable circuit after at least one-and-a-half clock cycles of the second input clock signal.

5. The clock switching system of claim 1, wherein:
the second clock domain subsystem further comprises a second domain pre-synchronization circuit operable to asynchronously receive the clock select signal and generate a second synchronized clock select signal that is synchronized with respect to the clock timing of the second input clock signal; and
the first clock domain subsystem further comprises a first domain enable circuit operable, using the synchronized clock select signal, to enable the first clock signal to control the clock output signal after an enable delay that is a function of the clock timing of the first input clock signal.

6. The clock switching system of claim 5, wherein the first clock domain subsystem further comprises:
an enable select circuit operable to output a selection between output from the first domain disable circuit and output from the first domain enable circuit according to a select state; and
a clock gate circuit operable to enable or disable control of the clock output signal by the first input clock signal according to the selection output from the enable select circuit.

7. The clock switching system of claim 6, wherein the enable select circuit comprises a multiplexer operable to receive the output from the first domain disable circuit, receive output from the first domain enable circuit, receive a select state signal, and output the selection to the clock gate circuit according to the select state signal.

8. The clock switching system of claim 1, wherein:
the feedback delay circuit comprises at least three flip-flops clocked according to the first input clock signal, such that a transition in the selection output from the enable select circuit is received at an input to a first flip-flop in the feedback delay circuit, and the transition is reflected on an output of a last flip-flop of the feedback delay circuit after at least three clock cycles of the first input clock signal; and
the select state of the enable select circuit is the output of the last flip-flop of the feedback delay circuit, such that the transition in the selection output from the enable select circuit is realized as a transition in the select state of the enable select circuit after the at least three clock cycles of the first input clock signal.

9. The clock switching system of claim 1, wherein the enable delay and the disable delay are designed so that the enable delay is longer than the disable delay when a clock frequency of the first input clock signal is between one-half and two-times that of the second input clock signal.

10. The clock switching system of claim 1, wherein:
the first domain disable circuit is operable to disable the first input clock signal from controlling the clock output signal by propagating a transition in the clock select signal through a disable path that includes a first set of components of the first clock domain subsystem, such that propagating the transition in the clock select signal through the disable path occurs over a disable path propagation time;
the second domain enable circuit is operable to enable the second input clock signal to control the clock output signal by propagating the transition in the clock select signal through an enable path that includes a second set of components of the first and second clock domain subsystems, such that propagating the transition in the clock select signal through the enable path occurs over an enable path propagation time; and
the disable path and the enable path are designed so that a path difference between the enable path propagation time and the disable path propagation time, less propagation delays associated with the first and second sets of components, is between $T_2-0.5T_1$ and $2T_2-0.5T_1$, where $T_1$ represents a clock period of the first input clock signal, and $T_2$ represents a clock period of the second input clock signal.

11. The clock switching system of claim 10, wherein:
disabling the first input clock signal from controlling the clock output signal begins a clock down time;

enabling the second input clock signal to control the clock output signal ends the clock down time; and the clock down time, less propagation delays associated with the first and second sets of components, is designed to be no greater than $2.5T_2-0.5T_1$.

12. The clock switching system of claim 1, wherein the first clock domain subsystem and the second clock domain subsystem comprise substantially symmetrical circuits.

13. A method for clock switching, the method comprising:
synchronizing a clock select signal to a first clock domain corresponding to a first input clock signal having first clock timing;
disabling, using the synchronized clock select signal, the first input clock signal from controlling a clock output signal after a disable delay that is a function of the clock timing of the first input clock signal;
enabling, using the synchronized clock select signal, a second input clock signal to control the clock output signal after an enable delay that is a function of clock timing of the second input clock signal, the clock timing of the second input clock signal being different from the clock timing of the first input clock signal, and the enable delay being longer than the disable delay; and
preventing changes in the selection output from the enable select circuit after a transition in the selection output occurs for a feedback delay that is a function of the clock timing of the first input clock signal.

14. The method of claim 13, wherein the synchronized clock select signal is a first synchronized clock select signal, and further comprising:
synchronizing the clock select signal to a second clock domain corresponding to the second input clock signal to generate a second synchronized clock select signal;
generating a first enable signal using the first synchronized clock select signal after an enable delay that is a function of the clock timing of the first input clock signal; and
generating a second disable signal using the second synchronized clock select signal after a disable delay that is a function of the clock timing of the second input clock signal;
wherein disabling the first input clock signal from controlling the clock output signal comprises:
generating a first disable signal using the first synchronized clock select signal after the disable delay that is a function of the clock timing of the first input clock signal;
passing the first disable signal and the first enable signal to a first enable selector; and
selecting the first disable signal using the first enable selector; and
wherein enabling the second input clock signal to control the clock output signal comprises:
generating a second enable signal using the second synchronized clock select signal after the enable delay that is a function of the clock timing of the second input clock signal;
passing the second disable signal and the second enable signal to a second enable selector; and
selecting the second enable signal using the second enable selector.

15. The method of claim 14, further comprising:
generating a first gated output by gating the first input clock signal and an output of the first enable selector, such that the first gated output substantially corresponds to the first input clock signal when the first enable selector selects the first enable signal, and the first gated output is held at a logical deselect value otherwise;

generating a second gated output by gating the second input clock signal and an output of the second enable selector, such that the second gated output substantially corresponds to the second input clock signal when the second enable selector selects the second enable signal, and the second gated output is held at the logical deselect value otherwise; and
generating a third gated output by gating the first gated output and the second gated output, such that the third gated output substantially corresponds to the first input clock signal when the first enable selector selects the first enable signal, and the third gated output substantially corresponds to the second input clock signal when the second enable selector selects the second enable signal.

16. The method of claim 14, further comprising:
propagating an output of the first enable selector through a first feedback delayer to generate a first delayed enable select signal that is delayed by a feedback delay as a function of the first input clock signal;
feeding the first delayed enable select signal back to a first select input of the first enable selector, wherein the first enable selector is operable to select between the first disable signal and the first enable signal according to the first select input;
propagating an output of the second enable selector through a second feedback delayer to generate a second delayed enable select signal that is delayed by a feedback delay as a function of the second input clock signal;
feeding the second delayed enable select signal back to a second select input of the second enable selector, wherein the second enable selector is operable to select between the second disable signal and the second enable signal according to the second select input.

17. The method of claim 13, wherein:
disabling, using the synchronized clock select signal, the first input clock signal from controlling the clock output signal after a disable delay that is a function of the clock timing of the first input clock signal;
enabling, using the synchronized clock select signal, the second input clock signal to control the clock output signal after an enable delay that is a function of the clock timing of the second input clock signal, the enable delay being longer than the disable delay
disabling the first input clock signal from controlling the clock output signal involves propagating a transition in the clock select signal through a set of disable path components over a disable path propagation time;
enabling the second input clock signal to control the clock output signal involves propagating the transition in the clock select signal through a set of enable path components over an enable path propagation time; and
the disable path components and the enable path components are designed so that a difference between the enable path propagation time and the disable path propagation time, less propagation delays associated with the disable path components and the enable path components, is between $T_2-0.5T_1$ and $2T_2-0.5T_1$, where $T_1$ represents a clock period of the first input clock signal, and $T_2$ represents a clock period of the second input clock signal.

18. A system comprising:
a first clock source that generates a first clock signal;
a second clock source that generates a second clock signal having different clock timing from that of the first clock signal; and a clock switching subsystem comprising:
- means for synchronizing a received clock select signal to a first clock domain corresponding to the first clock signal;
- means for disabling the first clock signal from controlling a clock output signal after a disable delay using the synchronized clock select signal, the disable delay being a function of the clock timing of the first clock signal;
- means for enabling the second clock signal to control the clock output signal after an enable delay using the synchronized clock select signal, the enable delay being a function of the clock timing of the second clock signal and being longer than the disable delay; and
- means for preventing changes in the selection output from the enable select circuit after a transition in the selection output occurs for a feedback delay that is a function of the clock timing of the first input clock signal.

19. The system of claim 18, wherein the clock switching subsystem is in communication with a dynamic voltage frequency scaling (DVFS) system operable to generate the clock select signal.

* * * * *